US012731902B2

(12) United States Patent
Kawamura et al.

(10) Patent No.: US 12,731,902 B2
(45) Date of Patent: Sep. 8, 2026

(54) COMMUNICATION DEVICE

(71) Applicant: Sony Group Corporation, Tokyo (JP)

(72) Inventors: Takashi Kawamura, Tokyo (JP); Yasuhiro Matsui, Tokyo (JP); Takuma Matsushita, Tokyo (JP); Kazuhiro Hongo, Tokyo (JP); Toshinori Kondo, Tokyo (JP); Futoshi Takeuchi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 84 days.

(21) Appl. No.: 18/860,752

(22) PCT Filed: May 8, 2023

(86) PCT No.: PCT/JP2023/017236
§ 371 (c)(1),
(2) Date: Oct. 28, 2024

(87) PCT Pub. No.: WO2023/228705
PCT Pub. Date: Nov. 30, 2023

(65) Prior Publication Data

US 2026/0188908 A1 Jul. 2, 2026

(30) Foreign Application Priority Data

May 27, 2022 (JP) ................................ 2022-087010

(51) Int. Cl.
*H01Q 9/04* (2006.01)
*H01Q 1/04* (2006.01)
(Continued)

(52) U.S. Cl.
CPC ............ *H01Q 9/0492* (2013.01); *H01Q 1/04* (2013.01); *H01Q 1/288* (2013.01); *H01Q 3/36* (2013.01);
(Continued)

(58) Field of Classification Search
None
See application file for complete search history.

(56) References Cited

U.S. PATENT DOCUMENTS 12,218,394 B2 * 2/2025 Imamura .................. H04B 1/18
12,341,236 B2 * 6/2025 Kim ...................... H04B 1/525
(Continued)

FOREIGN PATENT DOCUMENTS

JP H10-224145 A 8/1998
JP 2002-208808 A 7/2002
(Continued)

OTHER PUBLICATIONS

Lindenmeier S et al: "A Multifunctional Antenna for Terrestrial and Satellite Radio Applications",2001 IEEE MTT-S International Microwave Symposium Digest.(Ims 2001). Phoenix, AZ, May 20-25, 2001: [IEEE MTT-S International Microwave Symposium], New York, NY : IEEE, US, May 20, 2001 (May 20, 2001), pp. 393-396,XP001067305.

(Continued)

*Primary Examiner* — Jany Richardson
(74) *Attorney, Agent, or Firm* — XSENSUS LLP

(57) ABSTRACT

A communication device includes a circularly polarized antenna with a first antenna element and a second antenna element disposed orthogonally to the first antenna element; and a phase shifter that includes a capacitor connected to the first antenna element, and an inductor connected to the second antenna element, in which in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a
(Continued)

value calculated by $C=1/\{\pi f(R+X)\}$, and an inductance of the inductor is a value calculated by $L=(R-X)/(4\pi f)$.

16 Claims, 20 Drawing Sheets

(51) Int. Cl.

| | |
|---|---|
| ***H01Q 1/28*** | (2006.01) |
| ***H01Q 3/36*** | (2006.01) |
| ***H01Q 9/20*** | (2006.01) |
| ***H01Q 9/30*** | (2006.01) |
| ***H03H 7/18*** | (2006.01) |
| ***H03H 7/42*** | (2006.01) |

(52) U.S. Cl.

CPC ................. *H01Q 9/20* (2013.01); *H01Q 9/30* (2013.01); *H03H 7/18* (2013.01); *H03H 7/42* (2013.01)

(56) References Cited

U.S. PATENT DOCUMENTS

| | | | | |
|---|---|---|---|---|
| 12,407,093 | B2 * | 9/2025 | Sano | H01Q 1/521 |
| 2014/0159986 | A1 * | 6/2014 | De Luis | H01Q 1/521 343/852 |
| 2022/0216620 | A1 * | 7/2022 | Singh | H01Q 21/062 |
| 2023/0098813 | A1 * | 3/2023 | Fang | G02F 1/13 342/372 |
| 2023/0411846 | A1 * | 12/2023 | Nishimoto | H01Q 5/335 |

FOREIGN PATENT DOCUMENTS

| | | |
|---|---|---|
| JP | 2005-101761 A | 4/2005 |
| JP | 2010-021874 A | 1/2010 |
| JP | 2014-049785 A | 3/2014 |

OTHER PUBLICATIONS

Oda Taishi et al: "EM-Decoupled Orthogonal Dipole Rotating Electric Fields in Synchronization with Propeller",2020 International Symposium on Antennas and Propagation (ISAP), IEICE,Jan. 25, 2021 (Jan. 25, 2021), pp. 817-818, XP033894598.

International Search Report and Written Opinion mailed on Jun. 27, 2023, received for PCT Application No. PCT/JP2023/017236, filed on May 8, 2023, 09 pages including English Translation.

Schiffman, B.M., "A New Class of Broad-Band Microwave 90-Degree Phase Shifters", IEEE Transactions on Microwave Theory and Techniques [online], Jan. 6, 2003, vol. 6, Issue 2, 7 pages.

* cited by examiner

COMMUNICATION DEVICE

CROSS-REFERENCE TO RELATED APPLICATIONS

The present application is based on International Application No. PCT/JP2023/017236, filed May 8, 2023, and claims priority on Japanese Patent Application No. 2022-087010 filed on May 27, 2022, the entire contents of each are incorporated herein by reference.

TECHNICAL FIELD

The present technology relates to a communication device and relates to, for example, a communication device suitable for use in communication in a liquid.

BACKGROUND ART

In recent years, wireless communication such as wireless local area network (LAN) and non-contact communication has been widely spread. Patent Document 1 proposes a communication device that communicates with a communication device that is isolated underwater.

CITATION LIST

Patent Document

Patent Document 1: Japanese Patent Application Laid-Open No. 2010-21874

SUMMARY OF THE INVENTION

Problems to be Solved by the Invention

In water, for example, seawater, attenuation of electromagnetic waves increases due to high conductivity, and a frequency equal to or lower than a MHz band is thus generally selected as a communication frequency. In addition, because of the difficulty for the antenna to resonate in a medium having a high dielectric constant, designing a resonant antenna on the premise of use in such a medium has had challenges. For this reason, in a case where a general resonant antenna such as a half-wavelength dipole antenna is used as an antenna for performing communication in seawater, for example, the length of one wavelength is on the order of several-meters, thereby increasing the antenna size to cause challenges in the antenna design.

Even in a medium having high conductivity such as seawater, it has been desired to enable stable communication via an antenna having an electrically small size.

The present technology has been made in view of such a situation, and enables stable communication even with an antenna having an electrically small size.

Solutions to Problems

A first communication device according to an aspect of the present technology includes: a circularly polarized antenna that includes a first antenna element and a second antenna element disposed orthogonally to the first antenna element; and a phase shifter that includes a capacitor connected to the first antenna element, and an inductor connected to the second antenna element, in which in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a value calculated by $C=1/\{\pi f(R+X)\}$, and an inductance of the inductor is a value calculated by $L=(R-X)/(4\pi f)$.

A second communication device according to an aspect of the present technology includes a circularly polarized antenna that includes a first orthogonally linearly polarized antenna element and a second orthogonally linearly polarized antenna element; and a phase shifter that includes a capacitor connected to the first antenna element, and an inductor connected to the second antenna element, in which in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a value calculated by $C=1/\{2\pi f(R+X)\}$, and an inductance of the inductor is a value calculated by $L=(R-X)/(2\pi f)$.

The first communication device according to the aspect of the present technology is provided with the circularly polarized antenna that includes the first antenna element and the second antenna element disposed orthogonally to the first antenna element, and the phase shifter that includes the capacitor connected to the first antenna element, and the inductor connected to the second antenna element. In the case where the resistance is denoted by R, the imaginary unit is denoted by j, the reactance is denoted by X, the center frequency of the antenna is denoted by f, the capacitance is denoted by C, and the inductance is denoted by L, the impedance of the antenna is represented by R+jX, the capacitance of the capacitor is the value calculated by $C=1/\{\pi f(R+X)\}$, and the inductance of the inductor is the value calculated by $L=(R-X)/(4\pi f)$.

The second communication device according to the aspect of the present technology is provided with the circularly polarized antenna that includes the first orthogonally linearly polarized antenna element and the second orthogonally linearly polarized antenna element, and the phase shifter that includes the capacitor connected to the first antenna element, and the inductor connected to the second antenna element. In the case where the resistance is denoted by R, the imaginary unit is denoted by j, the reactance is denoted by X, the center frequency of the antenna is denoted by f, the capacitance is denoted by C, and the inductance is denoted by L, the impedance of the antenna is represented by R+jX, the capacitance of the capacitor is the value calculated by $C=1/\{2\pi f(R+X)\}$, and the inductance of the inductor is the value calculated by $L=(R-X)/(2\pi f)$.

Note that, the communication device may be an independent device or an internal block constituting one device.

MODE FOR CARRYING OUT THE INVENTION

Hereinafter, modes (hereinafter, referred to as embodiments) for implementing the present technology will be described.

<Configuration of Communication System>

Figure 1:
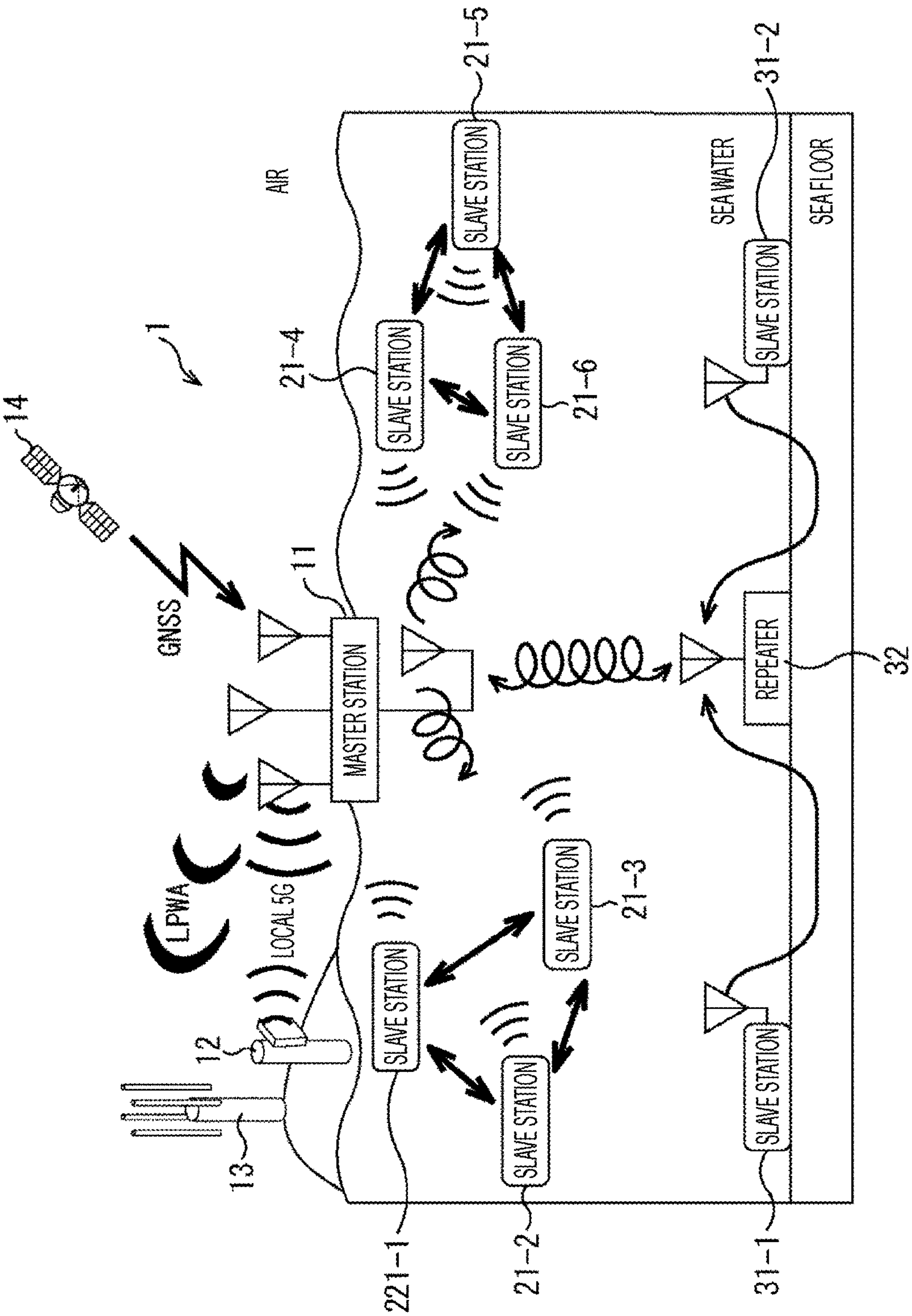
FIG. 1 is a diagram illustrating a configuration of an embodiment of a communication system to which the present technology is applied.

FIG. 1 is a diagram illustrating a configuration of an embodiment of a communication system 1 to which the present technology is applied. The communication system 1 illustrated in FIG. 1 includes a master station 11, a communication station 12, a communication station 13, a satellite 14, slave stations 21-1 to 21-6, slave stations 31-1 and 31-2, and a repeater 32. In the following description, in a case where it is not necessary to individually distinguish the slave stations 21-1 to 21-6, the slave stations 21-1 to 21-6 are simply described as a slave station 21. The same applies to the other drawings.

The master station 11 and the communication station 12 perform communication using a local 5G, for example. The master station 11 and the communication station 13 perform communication using, for example, low power wide area (LPWA). The master station 11 is capable of acquiring position information from the satellite 14 using, for example, a global navigation satellite system (GNSS). Here, the description will be continued with examples of the local 5G, the LPWA, and the GNSS, but it is also possible to configure such that communication using another communication network, for example, a wireless local area network (WLAN), a satellite communication network, or the like is performed.

The master station 11 also communicates with the slave station 21. In the master station 11, a portion that communicates with the communication station 12, the communication station 13, and the satellite 14 described above is located in the air, and a portion that communicates with the slave station 21 is located in seawater. The slave station 21 is located in the seawater.

Note that, here, a case where the environment in which the communication system 1 is installed is the sea will be described as an example, but the communication system 1 may be installed in an environment such as a lake, a pond, a river, or a water tank. The present technology described below can be applied to a device installed in a medium (lossy medium) excluding the lossless air. The lossy medium includes the inside of a human body and the like in addition to the seawater, brackish water lake, and other environments described above.

Here, a description will be given assuming that one of the master stations 11 is located in the air (in gas) and the other is located in the seawater (in liquid), but the master station 11 may be such that one is located on the sea floor (in solid) or in vacuum.

The configuration of the communication system 1 illustrated in FIG. 1 is an example, and is not described as a limitation. In the communication system 1 illustrated in FIG. 1, an example in which the master station 11 communicates with the communication station 12, the communication station 13, and the satellite 14 is illustrated, but the master station may further have a function of communicating with other than these, or may not have a function of being able to communicate with all of these, and may be capable of communicating with any one or two of them. The master station 11 may have only a function of communicating with the slave station 21, in other words, may not have a function of communicating with the communication station 12, the communication station 13, or the satellite 14.

Each of the slave stations 21-1 to 21-6 communicates with the master station 11. What is called an ad-hoc network in which the slave stations 21 communicate with each other may be configured. The slave station 21 is provided with, for example, a seawater sensing sensor, and transmits sensed data to the master station 11. The slave station 21 can have only a transmission function of transmitting data to the master station 11, or can have a transmission function and reception function of transmitting and receiving data to and from the master station 11 and another slave station 21. The slave station 21 is installed within a range of a depth of 0 to 10 m from the sea surface, for example.

Each of the slave stations 31-1 and 31-2 communicates with the repeater 32. The slave station 31 is provided with, for example, a seawater sensing sensor, and transmits sensed data to the repeater 32. The slave station 31 can have only a transmission function of transmitting data to the repeater 32, or can have a transmission function and reception function of transmitting and receiving data to and from the repeater 32 and another slave station 31. The slave station 31 is installed on the sea floor (near the sea floor).

Among antennas of the master station 11, an antenna that is installed in the seawater (in the liquid) and used for communication with the slave station 21 and the repeater 32 that are installed in the seawater is a circularly polarized antenna. Each of the antennas of the slave station 21 and the slave station 31 is a circularly polarized antenna or a linearly polarized antenna. The antenna of the repeater 32 is a circularly polarized antenna, and is used when communicating with the slave station 31 and when communicating with the master station 11 in the example illustrated in FIG. 1.

Figure 2:
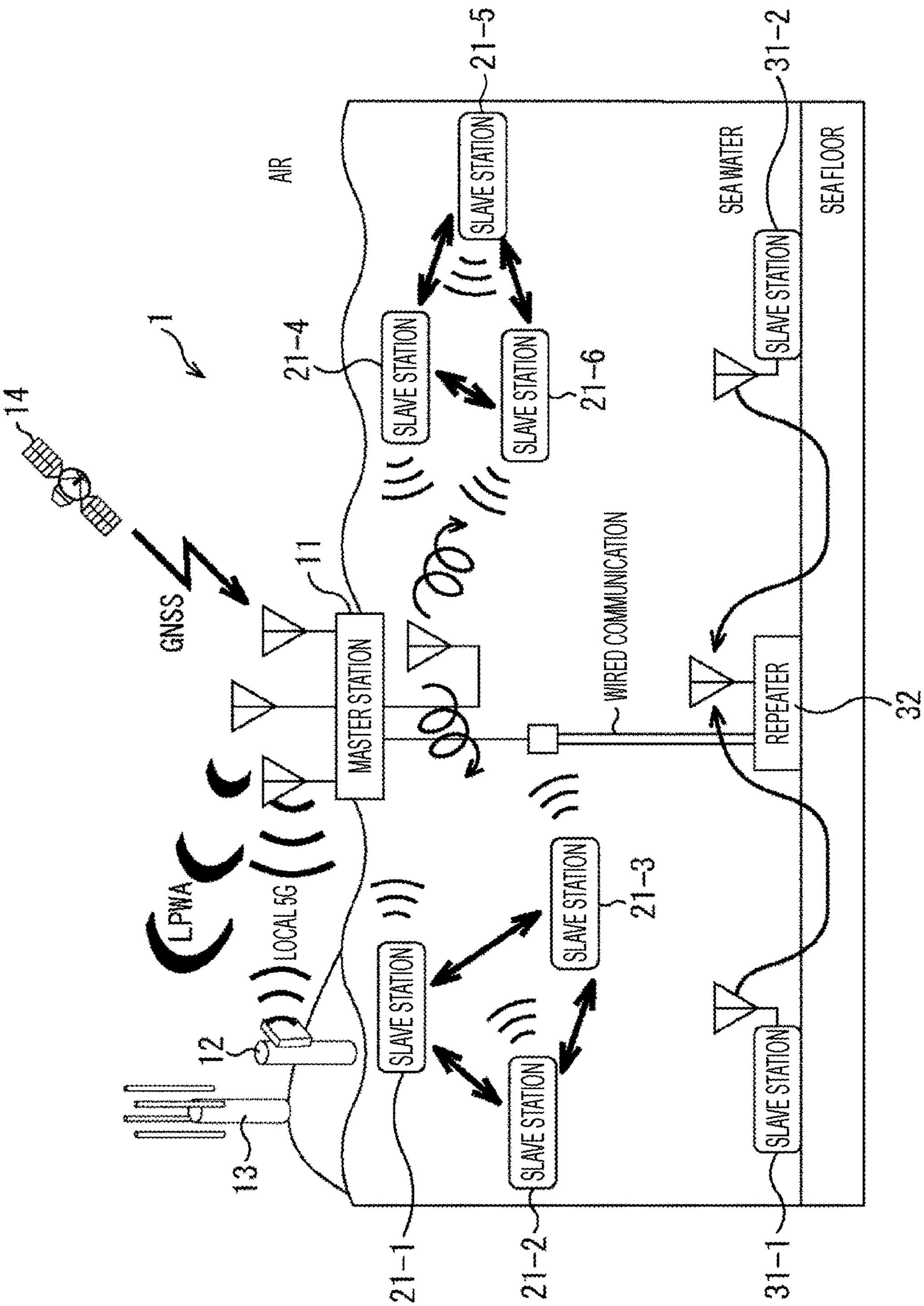
FIG. 2 is a diagram illustrating a configuration of another embodiment of a communication system to which the present technology is applied.
Figure 3:
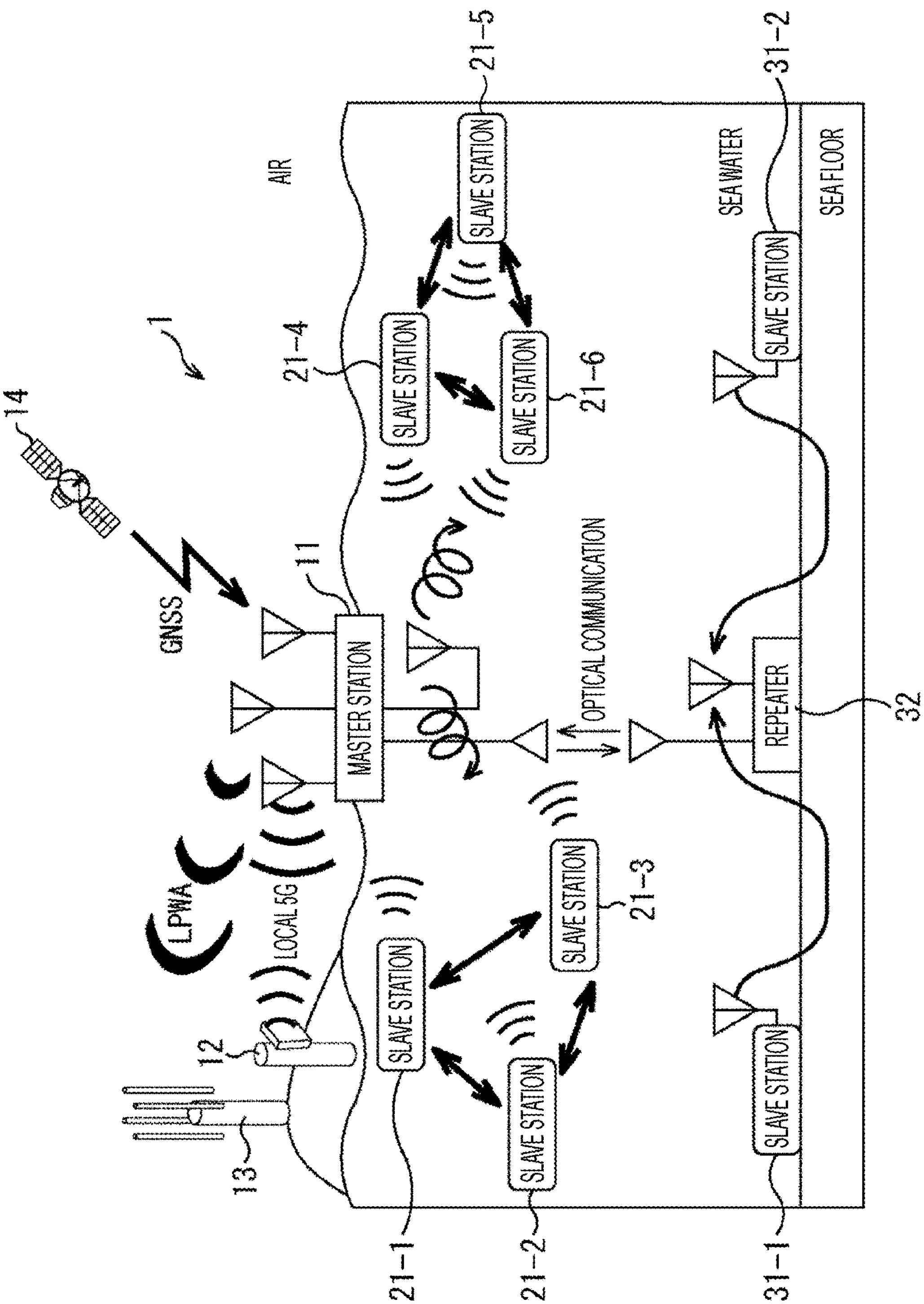
FIG. 3 is a diagram illustrating a configuration of another embodiment of a communication system to which the present technology is applied.

As illustrated in FIG. 2, the repeater 32 and the master station 11 can also be configured to perform wired communication. As illustrated in FIG. 3, the repeater 32 and the master station 11 can also be configured to perform optical communication.

The slave station 21 and the slave station 31 are grounded into the sea or the sea floor, but the positional relationship with the master station 11 and the repeater 32 is likely to be deviated from a positional relationship suitable for communication because of an influence of waves or the like. Since the receiving antennas that receive data from the master station 11 and the repeater 32, in other words, the slave station 21 and the slave station 31 are circularly polarized antennas, relatively favorable communication can be maintained even in a case where the positional relationship is deviated from an appropriate positional relationship.

As a path through which a signal from the slave station 21 that is installed in the sea is propagated to the master station 11, there are a direct wave that linearly travels between the antenna of the slave station 21 and the antenna of the master station 11, and a lateral wave that travels vertically upward from the antenna of the slave station 21 to the sea surface right above the antenna of the slave station 21, travels out through the sea surface and along the sea surface, and travels from the sea surface right above the antenna of the master station 11 to the antenna of the master station 11.

When the attenuation received by the lateral wave is smaller than the attenuation received by the direct wave, the lateral wave becomes dominant and is received by the master station 11. The lateral wave propagates farther than the direct wave, and the lateral wave thus becomes dominant as the distance between the slave station 21 and the master station 11 increases. Such a phenomenon occurs where the antenna is not far away from the sea surface.

As a path through which a signal from the slave station 31 that is installed in the sea floor is propagated to the repeater 32, there are a direct wave that linearly travels between the antenna of the slave station 31 and the antenna of the repeater 32, and a signal that travels vertically downward from the antenna of the slave station 31 to the sea surface right below the antenna of the slave station 31, travels along the sea floor, and travels from the sea floor near the antenna of the repeater 32 to the antenna of the repeater 32.

The signal propagating from the slave station 31 into the seawater has a large attenuation, but the signal propagating from the slave station 31 along the sea floor has a small attenuation. Therefore, the repeater 32 receives the signal propagating along the sea floor. By using the signal propagating along the sea floor, the network can be expanded in a wider range. Furthermore, the power consumption of the slave station 31 can be reduced. In a case where the slave station 31 is included in the configuration of a mesh network, the number of terminals required for the mesh network can be reduced.

<Configuration Example of Master Station>

Figure 4:
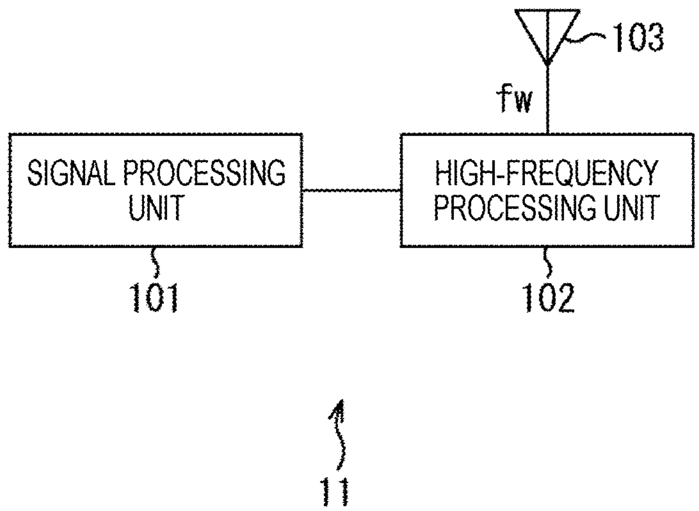
FIG. 4 is a diagram illustrating a configuration example of a master station.

FIG. 4 is a diagram illustrating a configuration example of the master station 11. The master station 11 illustrated in FIG. 4 includes a signal processing unit 101, a high-frequency processing unit 102, and an antenna 103. The antenna 103 of the master station 11 is installed in the seawater (liquid), and is used for communication with the slave station 21, the repeater 32, and another master station 11 installed in the seawater. The antenna 103 is a circularly polarized antenna.

The signal from the slave station 21 is received by the antenna 103 of the master station 11 and supplied to the high-frequency processing unit 102. The high-frequency processing unit 102 is configured, for example, to process a received signal or a signal to be transmitted. An operating frequency fw of the high-frequency processing unit 102 is set to, for example, 1 MHz or less.

The signal processed by the high-frequency processing unit 102 is supplied to the signal processing unit 101. For example, the signal processing unit 101 performs processing in a case where the signal processed by the high-frequency processing unit 102 is temporarily stored or the received signal is processed and transmitted.

The configuration of the master station 11 illustrated in FIG. 4 can also be applied as a configuration of the repeater 32. In a case where the configuration illustrated in FIG. 4 is the configuration of the repeater 32, the antenna 103 has a function of receiving a signal from the slave station 31 and a function of transmitting a signal to the master station 11 or another repeater 32. The high-frequency processing unit 102 and the signal processing unit 101 have a function of amplifying and transmitting a received signal.

<Configuration of Phase Shifter>

Figure 5:
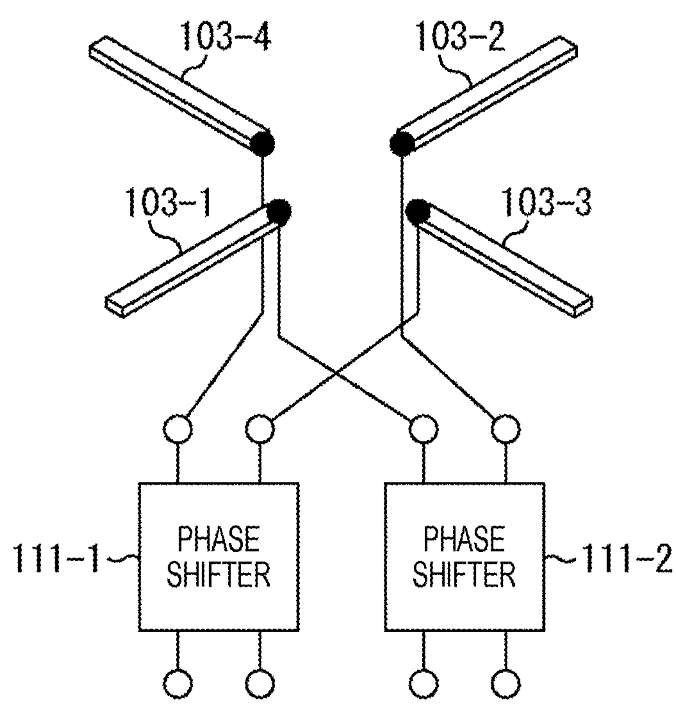
FIG. 5 is a diagram illustrating a configuration example of an antenna and a phase shifter.

FIG. 5 is a diagram illustrating a configuration example of the antenna 103 and a phase shifter 111 included in the high-frequency processing unit 102. In the following description, a case of the antenna 103 and the phase shifter 111 included in the master station 11 will be described as an example, but any of the slave station 21, the slave station 31, and the repeater 32 are applicable.

The antenna 103 is a circularly polarized antenna, and includes antenna elements 103-1 to 103-4 in the example illustrated in FIG. 5. A pair of the antenna element 103-1 and the antenna element 103-2 is arranged on a straight line to form a dipole antenna. A pair of the antenna element 103-3 and the antenna element 103-4 is arranged on a straight line to form a dipole antenna.

The dipole antenna including the antenna element 103-1 and the antenna element 103-2 and the dipole antenna including the antenna element 103-3 and the antenna element 103-4 are arranged to intersect at an angle of 90 degrees. The antenna 103 is a crossed-dipole antenna including the antenna elements 103-1 to 103-4, and is a circularly polarized antenna.

The antenna 103 illustrated in FIG. 5 is an antenna that can transmit and receive a circularly polarized signal by using two sets of linearly polarized balanced-antennas and arranging antenna elements (radiation elements) constituting the orthogonally polarized antennas to be orthogonal to each other.

The antenna element 103-1 and the antenna element 103-2 are connected to a phase shifter 111-2. The antenna element 103-3 and the antenna element 103-4 are connected to a phase shifter 111-1.

The master station 11 including the phase shifter 111 having such a configuration is installed in a medium having high conductivity such as seawater. In the medium having high conductivity, the attenuation of an electromagnetic wave is large, and in a case where communication over distances of several meters or more is performed, the communication using a frequency of a MHz band or less is generally performed. In such a case, the length of one wavelength is on the order of several meters, and for example, the size of the half-wavelength antenna is likely to be considerably large with respect to the communication device.

In addition, it is difficult to design a resonant antenna because the antenna hardly resonates in the conductive medium. For this reason, in a case where the length of one wavelength is on the order of several meters, and for example, a resonance-type antenna such as a half-wavelength dipole antenna is used as the antenna 103, the size of the antenna 103 is likely to be large.

Therefore, in a case where a circularly polarized antenna based on an electrically small non-resonant antenna is used, for example, it is necessary to use a high-frequency component.

Therefore, a circularly polarized antenna that includes a power supply unit (here, the phase shifter 111) having a low-cost and simple configuration based on a non-resonant antenna will be described.

Figure 6:
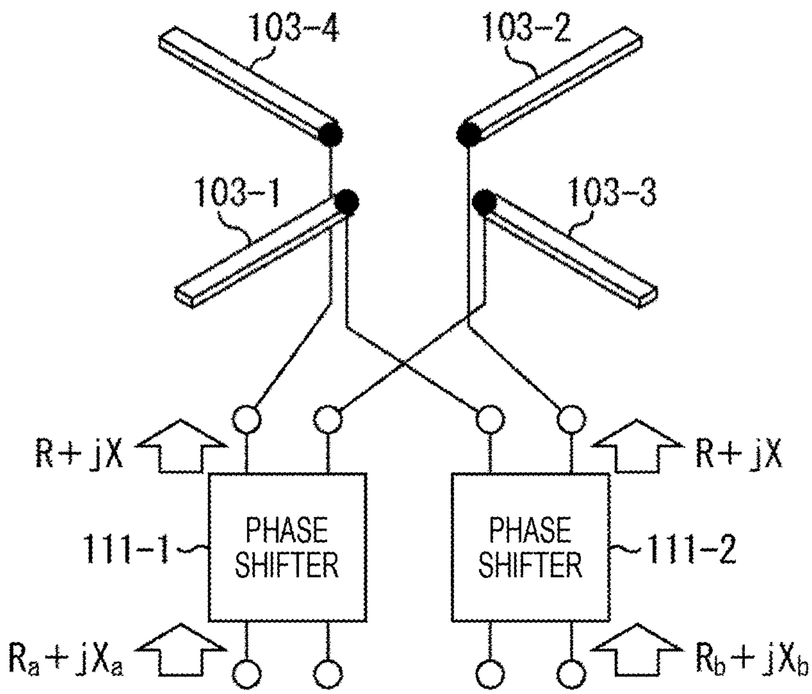
FIG. 6 is a diagram illustrating the condition related to the configuration of the phase shifter.

FIG. 6 is a diagram in which in addition to the phase shifter 111 and the antenna 103 illustrated in FIG. 5, the impedance in the phase shifter 111 is added. It is assumed that the impedance of the electrically small antenna (antenna 103) illustrated in FIG. 6 is denoted by R+jX. R in the impedance R+jX is the real part of impedance and represents a resistance. jX in R+jX is the imaginary part of impedance, j represents an imaginary unit, and X represents a reactance.

The impedance R+jX is an impedance when a pair of the antenna elements 103, for example, the antenna element 103-1 and the antenna element 103-2 is viewed from the phase shifter 111 side. As illustrated in FIG. 6, in a case where the impedance of the phase shifter 111-1 when viewed from the power supply side is Ra+jXa, the impedance when the antenna 103 is viewed from the phase shifter 111-1 is R+jX. Similarly, when the impedance to the phase shifter 111-2 is Rb+jXb, the impedance when viewed from the phase shifter 111-1 is R+jX.

In order to obtain circularly polarized waves by orthogonally arranging the dipole antenna including the antenna elements 103-1 and 103-2 and the dipole antenna including the antenna elements 103-3 and 103-4, the phase shifter 111 is only required to be connected to each of the antennas 103 so that the phase difference between the impedances of the individual antennas that are orthogonally arranged is 90 degrees. The condition that the phase difference is 90 degrees is expressed by the following equation (1).

$$Ra \times Rb + Xa \times Xb = 0 \tag{1}$$

In order to obtain a simple circuit without including a pure resistor, it is desirable that Ra=Rb=R, and there is no change in the real part. When Ra=Rb=R is substituted in equation (1) and rearranged, the following equation (2) is obtained.

$$Xa \times Xb = -R^2 \tag{2}$$

In a circularly polarized antenna having an ideal axial ratio of 1, the absolute values of the individual reflection coefficients are only required to be equal to each other. It is assumed that the phase shifter 111 is located between the antenna 103 and a high-frequency power supply (not illustrated). Assuming that a reflection coefficient when the phase shifter 111-1 is viewed from the power supply side is denoted by Ta, and that a reflection coefficient when the phase shifter 111-2 is viewed from the power supply side is denoted by Tb, the reflection coefficients Ta and Tb are represented by the following equations (3) and (4).

[Math. 1]

$$\Gamma_a = \frac{R + jX_a - Z_{ref}}{R + jX_a + Z_{ref}} \tag{3}$$

[Math. 2]

$$\Gamma_b = \frac{R - jR^2/X_a - Z_{ref}}{R - jR^2/X_a + Z_{ref}} \tag{4}$$

In equations (3) and (4), Zref represents a reference impedance. In a case where the reference impedance is set as a real number, the condition for the absolute value of the reflection coefficient Γa=the absolute value of the reflection coefficient Γb is obtained as $$Xa = R$$

The circuit capable of achieving this includes a circuit satisfying the following condition $$Xa = R,\ Xb = -R, \text{ and } R > |X|$$

Figure 7:
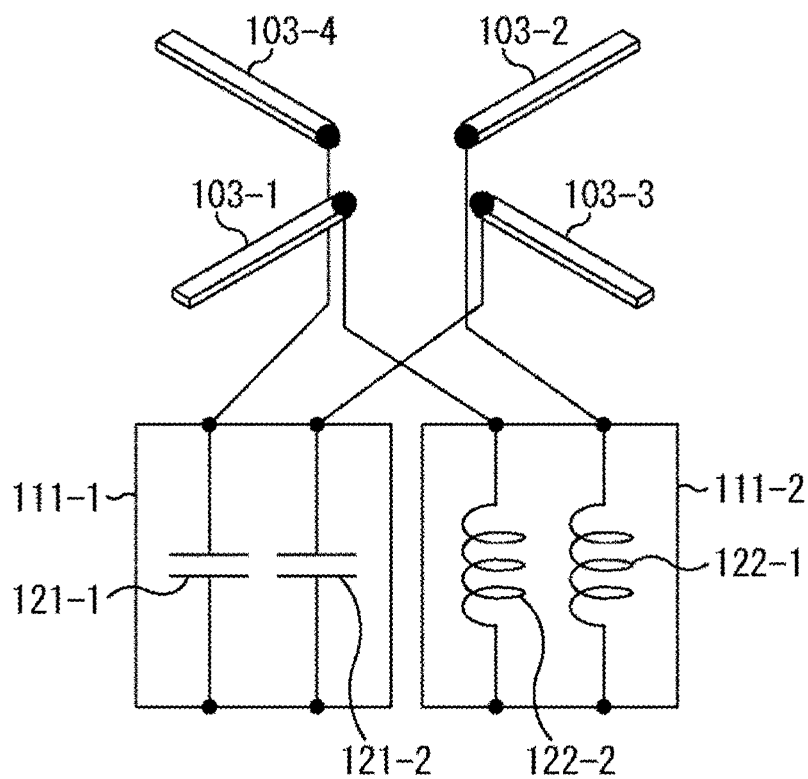
FIG. 7 is a diagram illustrating a configuration example of the phase shifter.

Therefore, as illustrated in FIG. 7, the phase shifter 111-1 is only required to have a capacitance C represented by the following equation (5), and the phase shifter 111-2 is only required to have an inductance L represented by the following equation (6). In equations (5) and (6), f represents a center frequency of the transmission or reception frequency (desired frequency).

[Math. 3]

$$C = \frac{1}{\pi f (R + X)} [F] \tag{5}$$

[Math. 4]

$$L = \frac{R - X}{4\pi f} [H] \tag{6}$$

The phase shifter 111-1 is provided with a capacitor 121-1 and a capacitor 121-2 each of which has the capacitance C calculated by equation (5). The phase shifter 111-2 is provided with an inductor 122-1 and an inductor 122-2 each of which has the inductance L calculated by equation (6).

The capacitor 121-1 in the phase shifter 111-1 is provided between the high-frequency power supply (not illustrated) and the antenna element 103-4, and the capacitor 121-2 is provided between the high-frequency power supply and the antenna element 103-3. The inductor 122-1 in the phase shifter 111-2 is provided between the high-frequency power supply and the antenna element 103-2, and the inductor 122-2 is provided between the high-frequency power supply and the antenna element 103-1.

Figure 8:
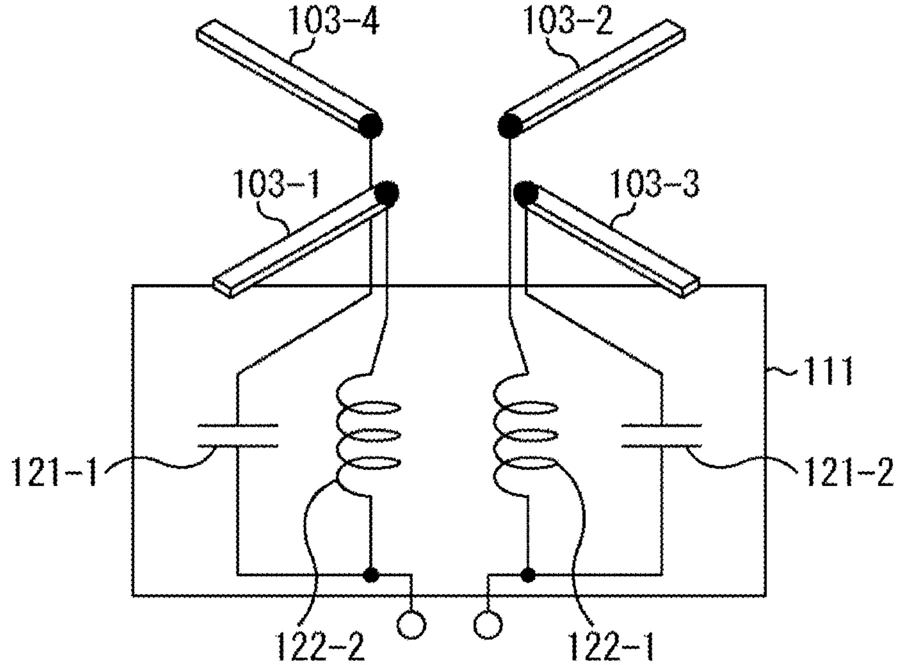
FIG. 8 is a diagram illustrating a configuration example of the phase shifter.

The configuration of the phase shifter 111 and the antenna 103 illustrated in FIG. 7 are redescribed as illustrated in FIG. 8. In FIG. 8, the phase shifter 111-1 and phase shifter 111-2 in FIG. 7 are collectively referred to as the phase shifter 111.

The phase shifter 111 includes the inductor 122-1 and the inductor 122-2, which are respectively connected to the antenna element 103-1 and the antenna element 103-2. The phase shifter 111 also includes the capacitor 121-1 and the capacitor 121-2, which are respectively connected to the antenna element 103-3 and the antenna element 103-4.

The capacitor 121-1 in the phase shifter 111 is provided between the high-frequency power supply (not illustrated) and the antenna element 103-4, and the inductor 122-2 is provided between the high-frequency power supply and the antenna element 103-1. The capacitor 121-1 and the inductor 122-2 are short-circuited on the power supply side.

The capacitor 121-2 in the phase shifter 111 is provided between the high-frequency power supply and the antenna element 103-3, and the inductor 122-1 is provided between the high-frequency power supply and the antenna element 103-2. The capacitor 121-2 and the inductor 122-1 are short-circuited on the power supply side.

An ideal circularly polarized antenna having an axis ratio of 1 at the frequency f can be formed with such a configuration of the phase shifter 111. The Phase shifter 111 capable of obtaining such an effect can be realized by four lumped constants. Therefore, the master station 11 that includes the phase shifter 111 and the antenna 103, the slave stations 21 and 31, and the repeater 32 can be downsized and manufactured at low cost.

<Another Configuration of Phase Shifter>

Figure 9:
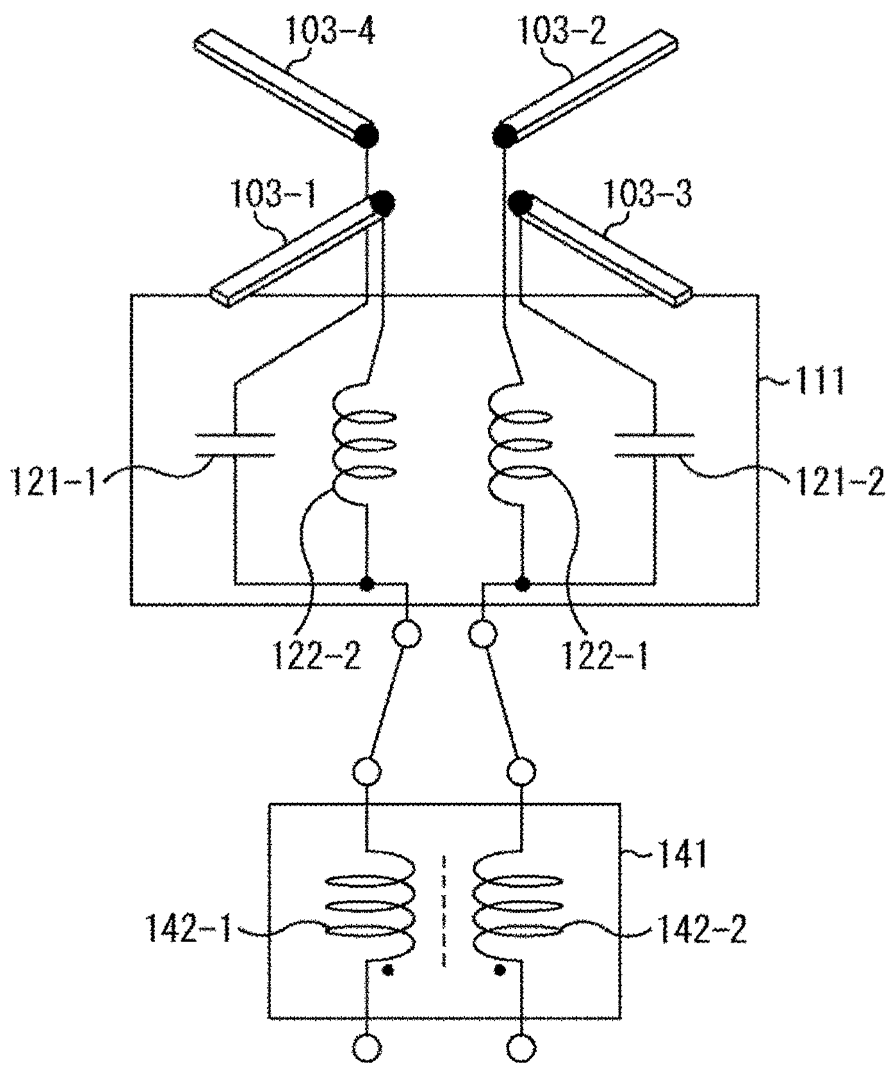
FIG. 9 is a diagram illustrating a configuration example of the phase shifter to which a balun is added.

FIG. 9 is a diagram illustrating another configuration example of the phase shifter 111. The phase shifter 111 illustrated in FIG. 9 is different from the phase shifter 111 illustrated in FIG. 8 in that a balun 141 is added, and the other points are the same. By inserting the balun, noise can be reduced, and characteristics can be stabilized.

The balun 141 illustrated in FIG. 9 is a float balun and includes a transformer 142-1 and a transformer 142-2. The two transformers are provided with, for example, ferrite cores with bifilar winding so that the polarities are the same as each other.

Figure 10:
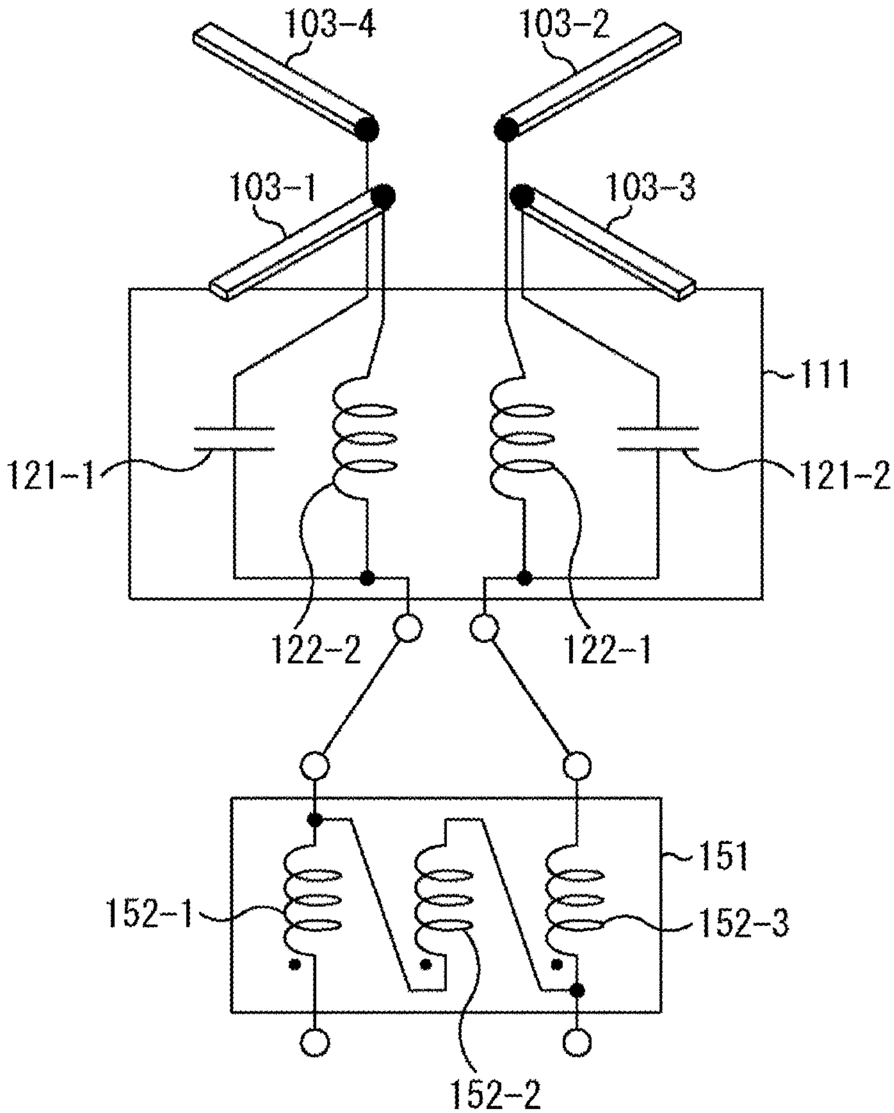
FIG. 10 is a diagram illustrating a configuration example of the phase shifter to which a balun is added.

FIG. 10 illustrates a configuration example of the phase shifter 111 to which a balun is added as in FIG. 9. FIG. 10 illustrates a case where a balun 151 added is a balun referred to as a forced balun.

The balun 151 includes transformers 151-1 to 151-3. The balun 151 is formed with, for example, wiring that is formed by trifilar-winding three lines around a toroidal core to have an impedance conversion ratio of 1:1, and forcibly converts balance and unbalance.

Figure 11:
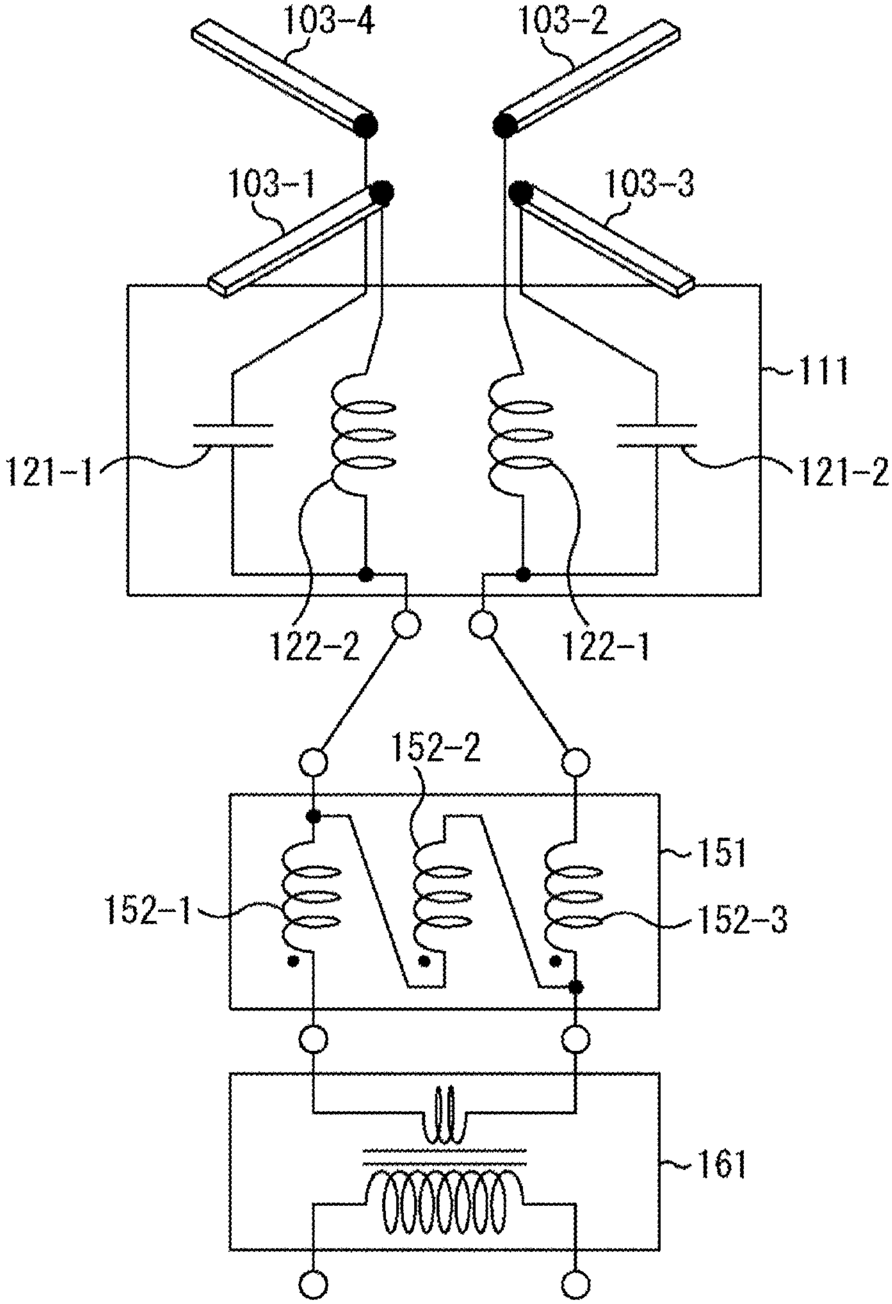
FIG. 11 is a diagram illustrating a configuration example of the phase shifter to which a matching circuit is added.

Furthermore, as illustrated in FIG. 11, a matching circuit 161 may be added to the balun 151. The matching circuit 161 includes a transformer that includes a coil on a primary side and a coil on a secondary side, and transmits power using mutual induction between the coil on the primary side and the coil on the secondary side, and performs impedance matching by impedance-voltage conversion according to a winding ratio of the two coils.

Although the configuration in which the matching circuit 161 is added to the balun 151 is illustrated in FIG. 11, the matching circuit 161 can be added to the balun 141 (FIG. 9).

Figure 12:
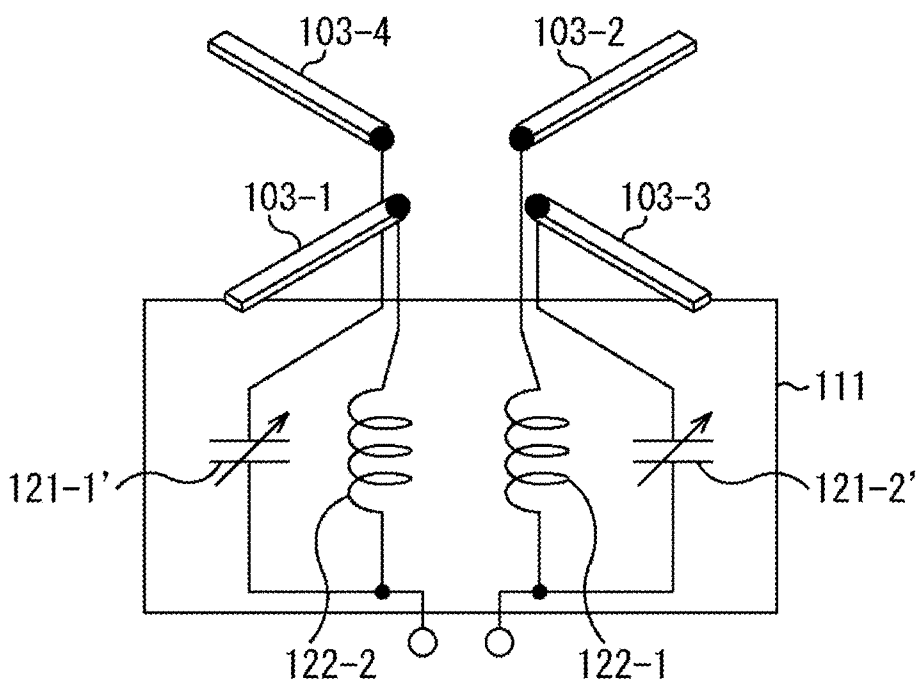
FIG. 12 is a diagram illustrating another configuration example of the phase shifter.

FIG. 12 is a diagram illustrating a configuration of another phase shifter 111. The phase shifter 111 illustrated in FIG. 12 has the same configuration as that of the phase shifter 111 illustrated in FIG. 8, except that the capacitors 121-1 and 121-2 includes capacitors 121-1' and 121-1' having variable capacitance, and the other points are the same.

The capacitors 121-1' and 121-1' can be, for example, capacitors of which capacitance can be variable by external control such as varicaps.

The phase shifter 111 is included in, for example, the master station 11, and the master station 11 is assumed to be affected by the surrounding environment. When the master station 11 is affected by the surrounding environment, there is a risk of causing changes in the impedance of the antenna 103. The capacitance of the capacitor 121 is made variable to enable following such a change in the impedance of the antenna 103 and returning (being adjusted) to an appropriate impedance.

Here, the case where the capacitor 121 is variable has been described as an example, but the inductor 122 may be variable. In addition, both the capacitor 121 and the inductor 122 may be variable. At least one of the capacitor 121 or the inductor 122 can be variable.

The phase shifter 111 may be provided with an adjustment unit that adjusts the capacitor 121 and/or inductor 122 being variable to follow changes in the impedance.

The balun 141 (FIG. 9) or the balun 151 (FIG. 10) can also be connected to the phase shifter 111 illustrated in FIG. 12. Furthermore, the balun 151 (141) and the matching circuit 161 can also be connected to the phase shifter 111 illustrated in FIG. 12.

Figure 13:
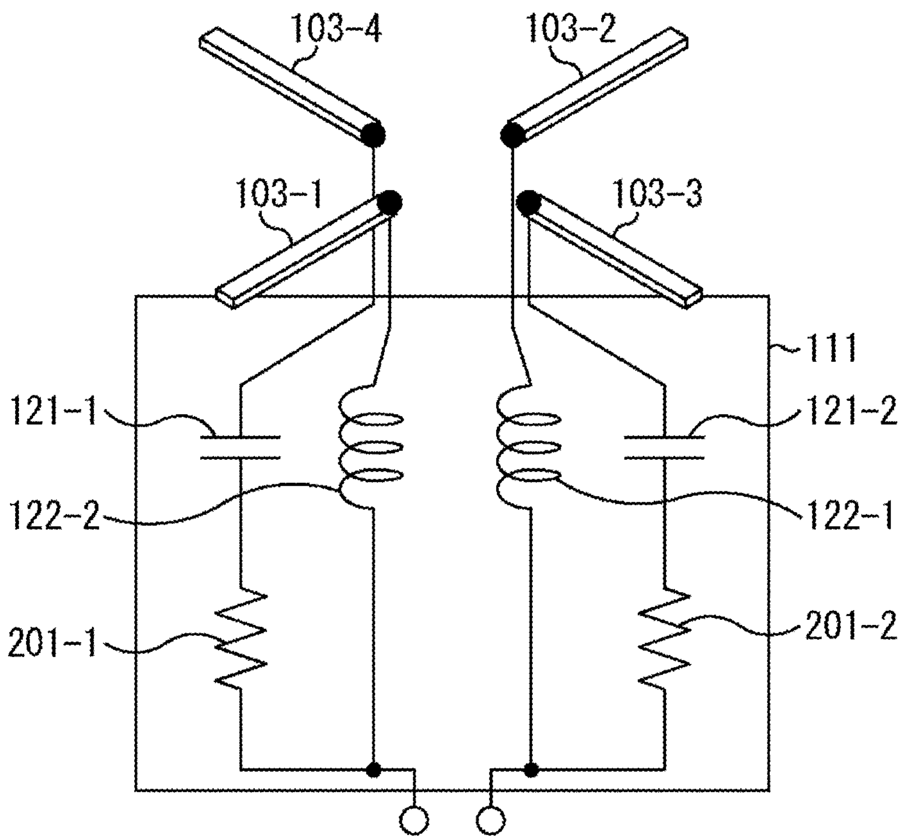
FIG. 13 is a diagram illustrating another configuration example of the phase shifter.

FIG. 13 is a diagram illustrating a configuration of another phase shifter 111. The phase shifter 111 illustrated in FIG. 13 is different from the phase shifter 111 illustrated in FIG. 8 in that a resistor 201 is added, and the other points are the same.

The actual circuit element may not have the ideal capacitance C or inductance L calculated by equation (5) or (6). For example, the inductor 122 generally has an equivalent series resistance (ESR), and the ideal capacitance C or inductance L calculated by equation (5) or (6) may not be obtained due to this equivalent series resistance.

A compensation circuit can be provided to achieve the ideal capacitance C or inductance L calculated by equation (5) or (6).

In the phase shifter 111 illustrated in FIG. 13, the resistor 201 having a resistance value corresponding to the equivalent series resistance is provided on the capacitor 121 side so that the impedance is not unbalanced by the equivalent series resistance of the inductor 122. A resistor 201-1 is connected in series to the capacitor 121-1 of the phase shifter 111, and a resistor 201-2 is connected in series to the capacitor 121-2.

Figure 14:
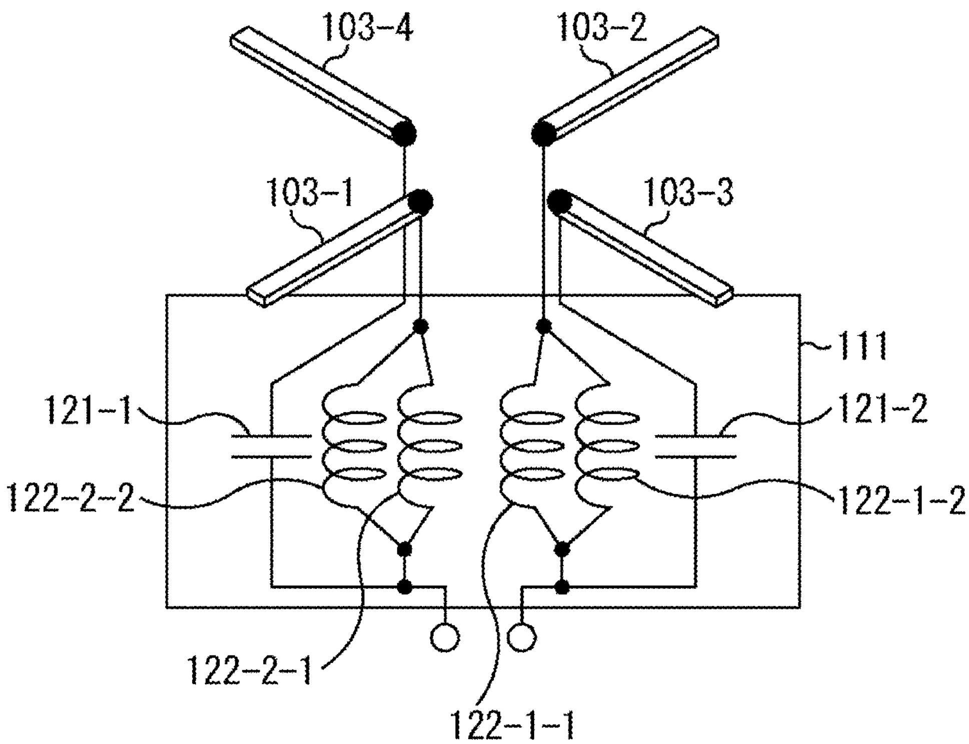
FIG. 14 is a diagram illustrating another configuration example of the phase shifter.

As the phase shifter 111 illustrated in FIG. 14, a configuration example in which the inductors 122 are provided in parallel as the compensation circuit is illustrated. In the phase shifter 111 illustrated in FIG. 14, an inductor 122-1-1 and an inductor 122-1-2 are connected in parallel, ends thereof on one side are connected to the antenna element 103-2, and ends thereof on the other side are connected to a power supply (not illustrated). In addition, in the phase shifter 111 illustrated in FIG. 14, an inductor 122-2-1 and an inductor 122-2-2 are connected in parallel, ends thereof on one side are connected to the antenna element 103-1, and ends thereof on the other side are connected to the power supply (not illustrated).

By employing the parallel arrangement for the inductors 122, the influence of the equivalent series resistance of the inductor 122 can be reduced. In addition, in a case where it is not possible to obtain the inductance L represented by equation (6) by using one inductor 122, for example, a case where there is no element corresponding to the inductance L calculated by equation (6) in the E12 series or the E24 series, a plurality of the inductors 122 can be used to obtain the inductance L calculated by equation (6).

Figure 15:
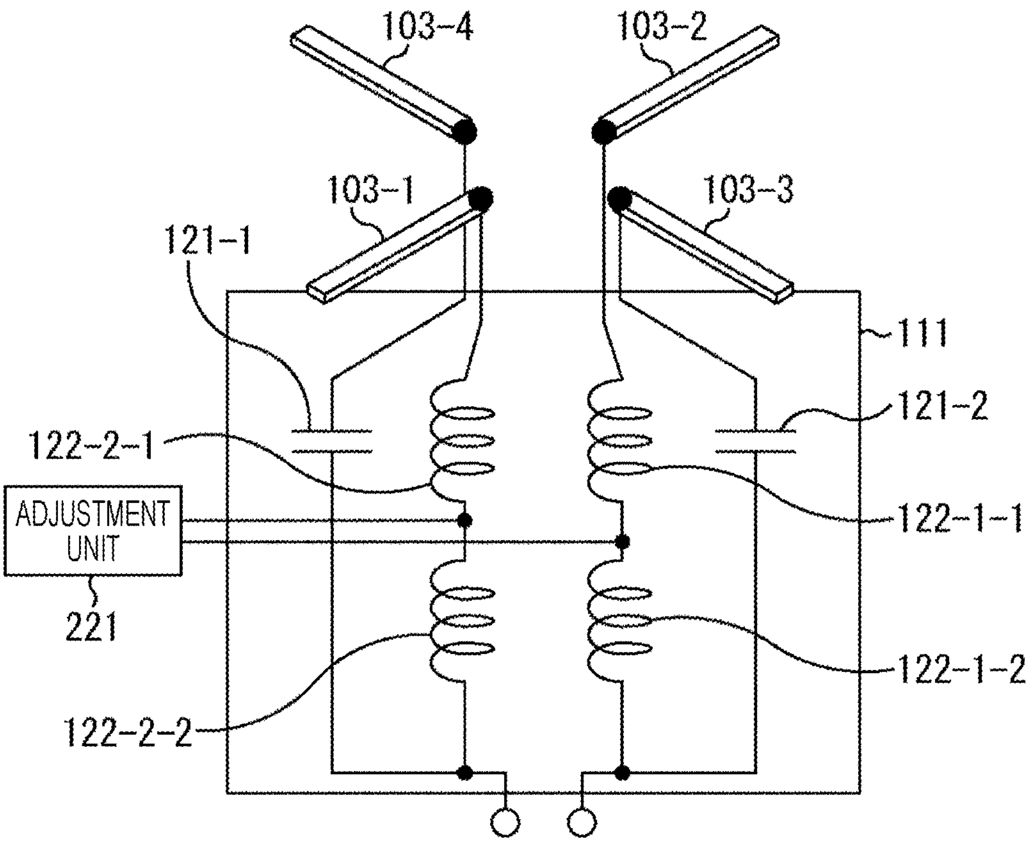
FIG. 15 is a diagram illustrating another configuration example of the phase shifter.

Instead of the parallel connection, the series connection may be employed for the inductors 122 as illustrated in FIG. 15. As the phase shifter 111 illustrated in FIG. 15, a configuration example in which the inductors 122 are provided with the parallel arrangement as the compensation circuit, and an adjustment unit 221 is added is illustrated.

In the phase shifter 111 illustrated in FIG. 15, the inductor 122-1-1 and the inductor 122-1-2 are connected in series, ends thereof on one side are connected to the antenna element 103-2, and ends thereof on the other side are connected to the power supply (not illustrated). In addition, in the phase shifter 111 illustrated in FIG. 15, the inductor 122-2-1 and the inductor 122-2-2 are connected in series, ends thereof on one side are connected to the antenna element 103-1, and ends thereof on the other side are connected to the power supply (not illustrated).

The adjustment unit 221 is provided between the inductor 122-1-1 and the inductor 122-1-2, which are connected in series, and between the inductor 122-2-1 and the inductor 122-2-2, which are connected in series. The adjustment unit 221 adjusts the inductance L of the inductor 122-1 including the inductor 122-1-1 and the inductor 122-1-2 and the inductance L of the inductor 122-2 including the inductor 122-2-1 and the inductor 122-2-2.

The balun 141 (FIG. 9) or the balun 151 (FIG. 10) can also be connected to the phase shifter 111 illustrated in FIGS. 12 to 15. Furthermore, the balun 151 (141) and the matching circuit 161 can also be connected to the phase shifter 111 illustrated in FIGS. 12 to 15.

As described above, a circuit configuration for compensating for a manufacturing error and parasitic impedance generated in the operation can be employed.

For example, since the repeater 32 and other devices are installed in seawater, a circuit such as the phase shifter 111 is protected by a resin such as silicon for waterproof processing. In such a configuration, a parasitic impedance is likely to be generated with a material such as silicon. It is possible to employ a compensation circuit in consideration of the occurrence of such parasitic impedance occurring in the operation.

<Shape of Antenna>

Figure 16:
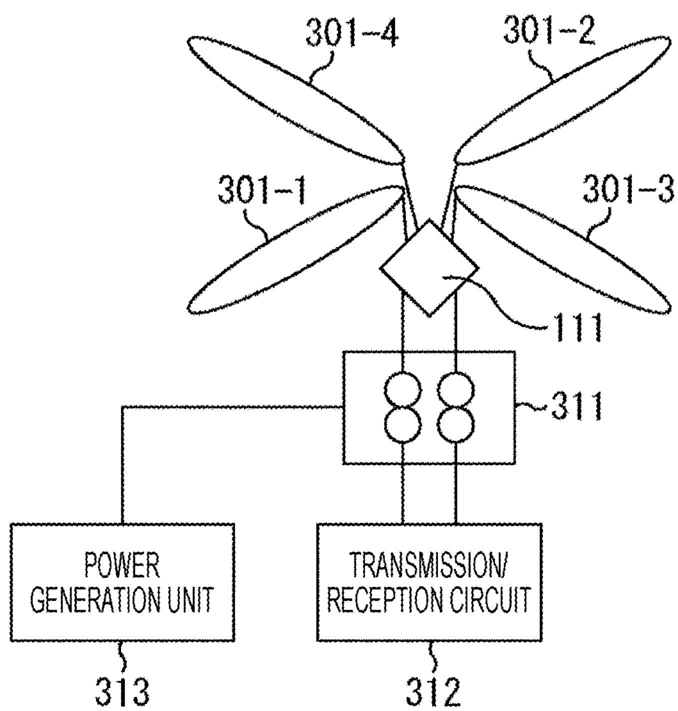
FIG. 16 is a diagram illustrating the shape of antennas.

FIG. 16 is a diagram illustrating a configuration example in a case where the antenna includes a propeller antenna 301.

The antenna illustrated in FIG. 16 includes antenna elements 301-1 to 301-4, and is configured in a propeller type. The propeller-type antenna elements 301 are configured to rotate by wave force or tidal force. For example, each of the antenna elements 301 is processed to have a shape on which the wave force is easily exerted, and the antenna 301 is processed into a shape that is easily rotated by the wave force.

The antenna elements 301 constitutes a crossed-dipole antenna, which is the same as the above-described antenna elements 103 (FIG. 8). The antenna elements 301 are connected to the phase shifter 111. The phase shifter 111 has a configuration to which any one of the phase shifters 111 described with reference to FIGS. 8 to 15 is applied. The output from the phase shifter 111 is supplied to the movable contact portion 311 using a slip ring or other units.

Terminals of the movable contact portion 311 connected to the antenna elements 301 are provided on the antenna element 301 side, and the terminals rotate in accordance with the rotation of the antenna elements 301. Terminals provided to be in contact with the rotating terminals are fixed terminals, and connected to a transmission/reception circuit 312.

The transmission/reception circuit 312 processes signals that are received by the antenna elements 301 and supplied via the movable contact portion 311. In addition, the transmission/reception circuit 312 generates signals desired to be transmitted by the antenna elements 301, and supplies the signals to the antenna elements 301 via the movable contact portion 311.

The movable contact portion 311 is also connected to the power generation unit 313. The power generation unit 313 generates power by using the rotation of the antenna 301. The power generated by the power generation unit 313 may be stored in a storage battery (not illustrated).

The master station 11, the slave stations 21 and 31, and the repeater 32 each of which has the antenna 301 and the power generation unit 313 can be operated using the power generated by the power generation unit 313.

Figure 17:
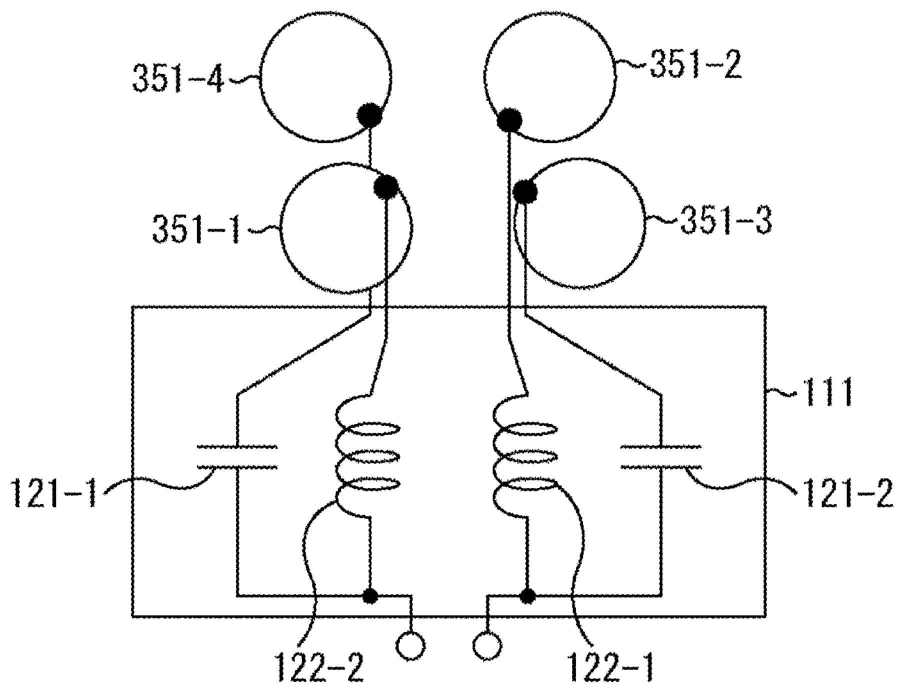
FIG. 17 is a diagram illustrating the shape of antennas.
Figure 18:
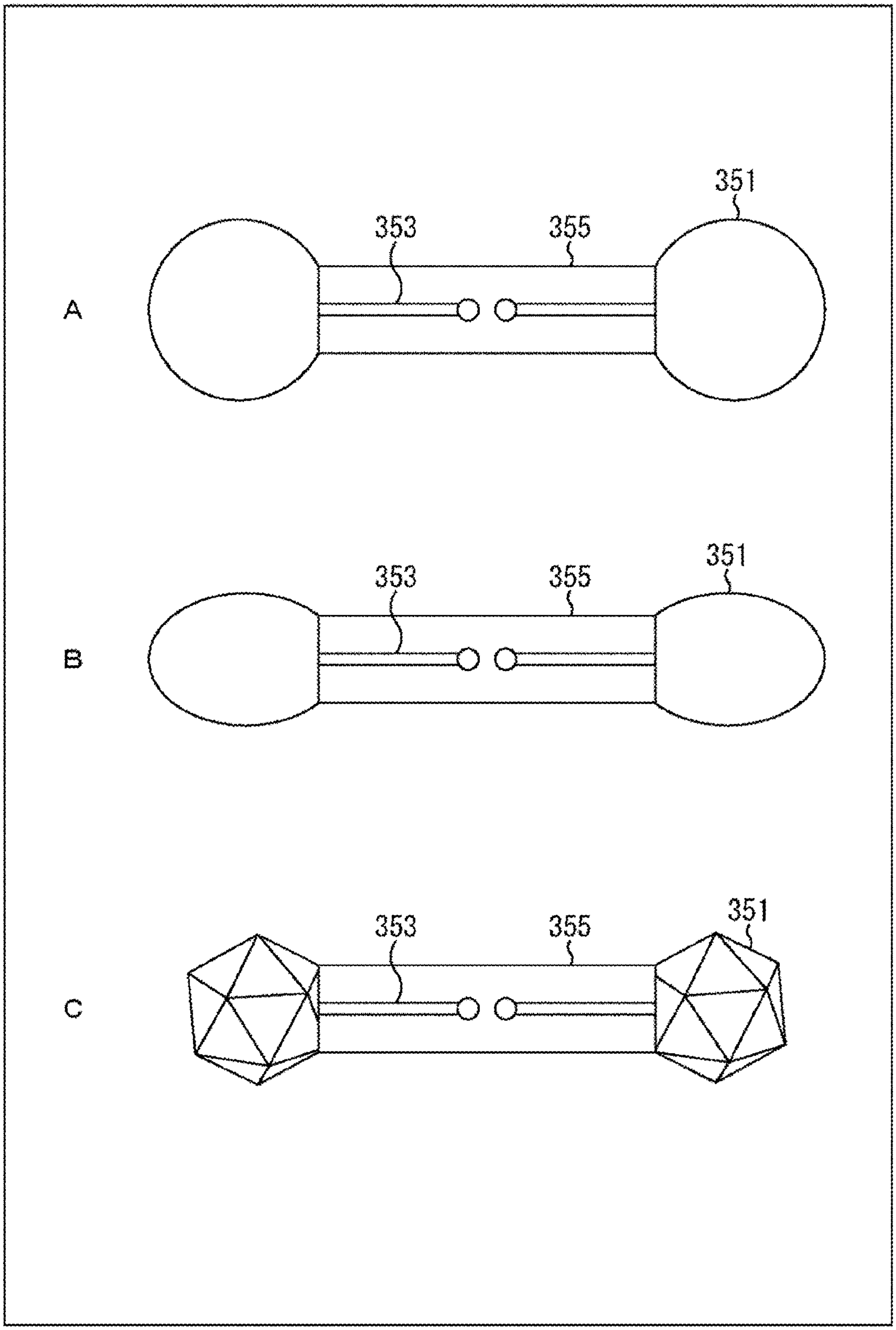
FIG. 18 is a diagram illustrating the shape of antennas.

FIG. 17 is a diagram illustrating another shape of the antenna. An antenna illustrated in FIG. 17 includes spherical antenna elements 351-1 to 351-4. FIG. 18 illustrates a configuration of each pair included in the antenna 301. One pair included in the antenna 301, for example, the antenna element 351-1 and the antenna element 351-2 include a pair of electrodes 351 and a sheath portion 355.

The sheath portion 355 includes a pair of wiring lines 353 that electrically connect the electrodes 351 and power supply terminals corresponding to the electrodes 351. The sheath portion 355 has, for example, a columnar shape extending in a direction along which the connection between the pair of electrodes 351 is made. As the columnar shape, a shape of a cylinder or a prism is assumed.

The sheath portion 355 may include a low-loss dielectric therein. As the low-loss dielectric, for example, air, pure water, resin, glass, ceramic materials, and other materials are assumed. Note that, the low-loss dielectric inside the sheath portion 355 may include a plurality of materials.

The shape of the electrodes 351 can be spherical as illustrated in A of FIG. 18, and is any shape as long as it is close to a sphere. For example, as illustrated in B of FIG. 18, the shape may be a shape of a spheroid.

For the convenience of manufacture, surfaces thereof may not be smooth, and the shape may be a polyhedral shape as illustrated in C of FIG. 18. In this case, icosahedron or higher polyhedrons can be employed. The shape may be other than the regular polyhedron.

Each of the electrodes 351 has a diameter larger than the width of the wiring line 353 regardless of the shape even though the diameter is the smallest diameter. As a material of the electrodes 351, for example, a metal having high corrosion resistance such as copper (Cu), aluminum (Al), gold (Au), platinum (Pt), or silver (Ag), an alloy thereof, or other material is assumed. The dielectrics may be provided inside the electrodes 351. In this case, the dielectrics inside the electrodes 351 may include a plurality of materials.

Since the antenna has the configuration as illustrated in FIG. 18, transmission characteristics in the antenna for wireless communication via the lossy medium can be improved.

<Application to Unbalanced Antenna>

In the above-described embodiments, the description has been given with the balanced antenna taken as an example. The present technology is not limited to the application to the balanced antenna, but can also be applied to an unbalanced antenna. Hereinafter, the present technology applied to an unbalanced antenna will be described.

Figure 19:
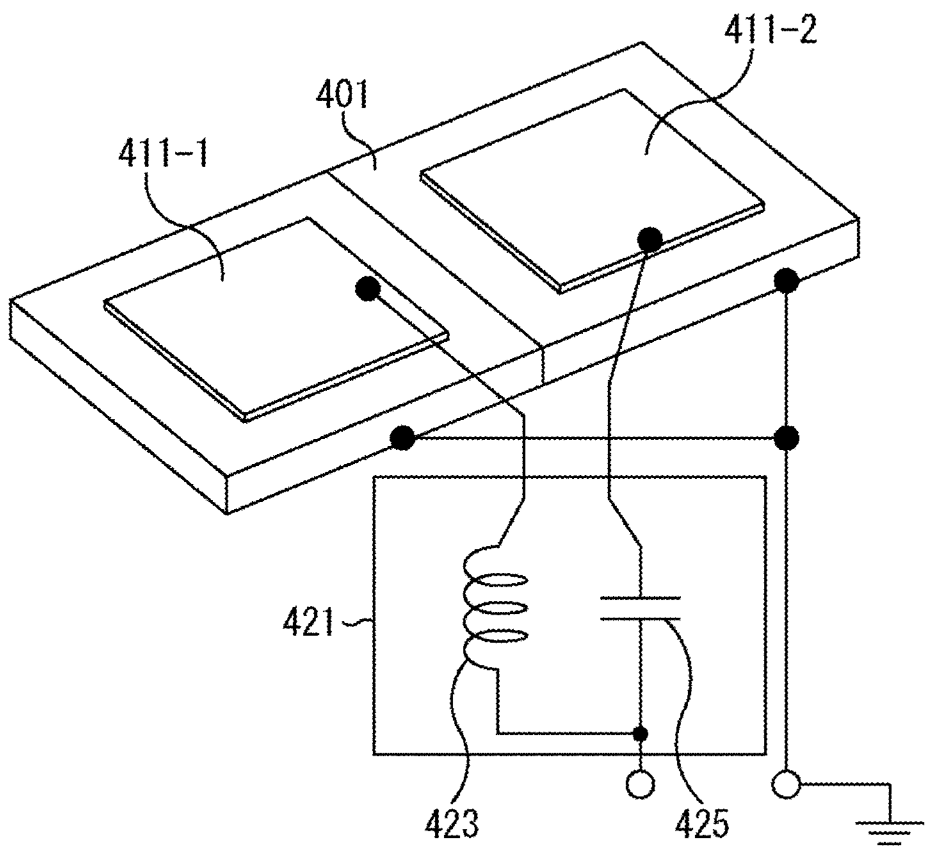
FIG. 19 is a diagram illustrating a configuration example of an antenna.

An antenna 401 illustrated in FIG. 19 is an antenna that implements circularly polarized waves by supplying power to an orthogonally linearly polarized radiation element 411-1 and an orthogonally linearly polarized radiation element 411-2 with a phase difference of 90 degrees. Each of the radiation element 411-1 and the radiation element 411-2 illustrated in FIG. 19 is a linearly polarized microstrip antenna (sometimes, referred to as a patch antenna). The microstrip antenna is a planar antenna including a dielectric substrate, and radiation elements (antenna elements) formed using printed wiring, and ground planes, the radiation elements and the ground planes being formed on both surfaces of the dielectric substrate.

The antenna 401 are connected to a phase shifter 421. The phase shifter 421 includes an inductor 423 and a capacitor 425. The inductor 423 is connected to the radiation element 411-1, and the capacitor 425 is connected to the radiation element 411-2. The inductance 423 and the capacitance 425 are short-circuited on the opposite side to the antenna 401 side. The back surface (the surface opposite to the surface on which the radiation elements 411 are provided) of the dielectric substrate constituting the antenna 401 is entirely grounded.

In the unbalanced antenna, an equation for obtaining the capacitance C corresponding to the above-described equation (5) is the following equation (7), and an equation for obtaining the inductance L corresponding to the above-described equation (6) is the following equation (8).

[Math. 5]

$$C = \frac{1}{2\pi f(R+X)}[F] \quad (7)$$

[Math. 6]

$$L = \frac{R-X}{2\pi f}[H] \quad (8)$$

The capacitor 425 constituting the phase shifter 421 is the capacitance C calculated by equation (7), and the inductor 423 is the inductance L calculated by equation (8).

Figure 20:
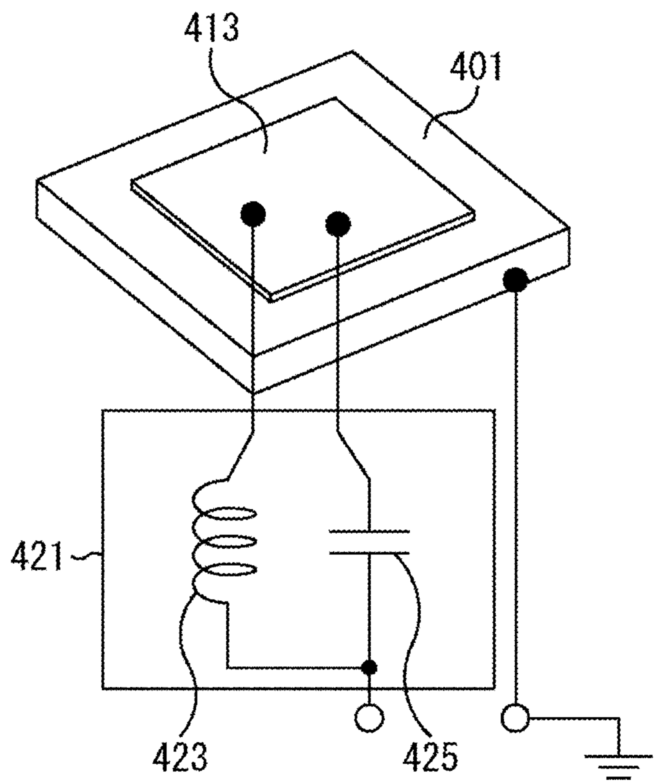
FIG. 20 is a diagram illustrating a configuration example of an antenna.

FIG. 20 is a diagram illustrating still another shape of the antenna. The antenna 401 illustrated in FIG. 20 is a circularly polarized microstrip antenna. A radiation element of the microstrip antenna may be circularly polarized by notching or other methods to use the antenna as the circularly polarized antenna 401 described above.

The signal supplied to the radiation element 413 via the inductor 423 of the phase shifter 421 is a signal having a phase shifted by 90 degrees from the signal supplied to the radiation element 413 via the capacitor 425.

Figure 21:
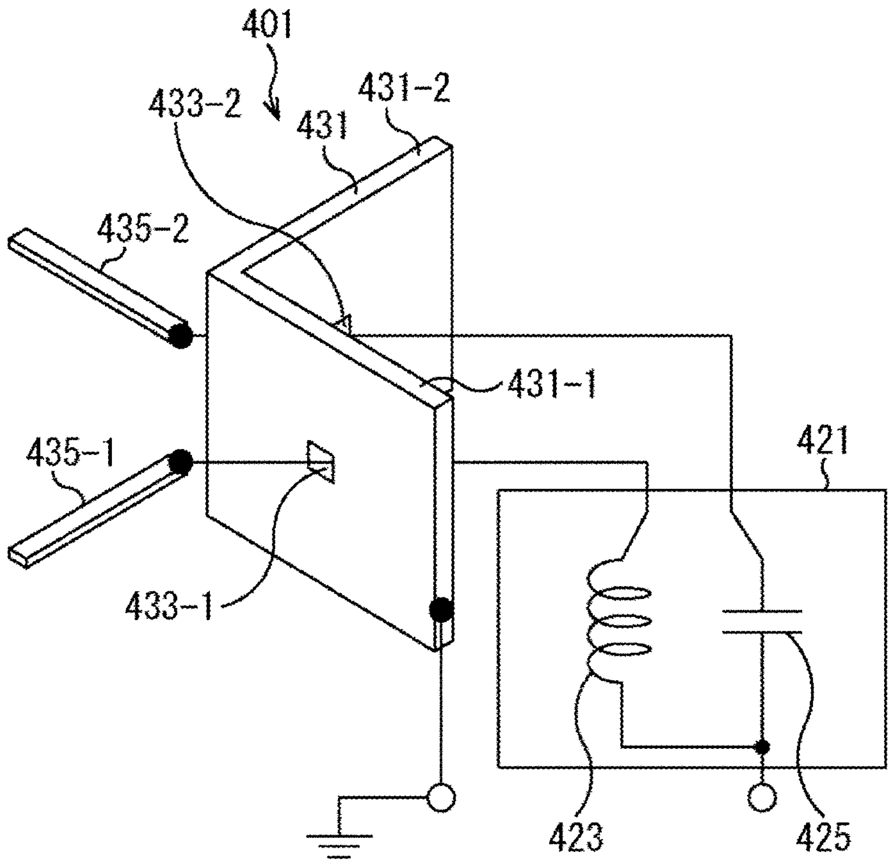
FIG. 21 is a diagram illustrating a configuration example of an antenna.

FIG. 21 is a diagram illustrating still another shape of the antenna. The antenna 401 illustrated in FIG. 21 is an antenna to which a monopole antenna is applied. The antenna 401 includes an L-shaped metal sheet 431. The metal sheet 431 has two orthogonal surfaces. A hole 433-1 is formed on one surface (metal sheet 431-1), and a hole 433-2 is formed on the other surface (metal sheet 431-2).

A wiring line is passed through the hole 433-1, one side of the wiring line is connected to the inductor 423 of the phase shifter 421, and the other side is connected to the antenna element 435-1. The antenna element 435-1 and the metal sheet 431-1 constitute a set of monopole antenna. A wiring line is passed through the hole 433-2, one side of the wiring line is connected to the capacitor 425 of the phase shifter 421, and the other side is connected to the antenna element 435-2. The antenna element 435-2 and the metal sheet 431-2 constitute a set of monopole antenna.

The antenna 401 is configured such that two sets of monopole antennas are arranged in an orthogonal positional relationship. The two sets of monopole antennas are arranged to be orthogonal to each other, and the antenna 401 functions as a circularly polarized antenna when a signal whose phase is shifted by 90 degrees is supplied.

In the phase shifter 421 illustrated in FIGS. 19 to 21, the inductor 423 and the capacitor 425 can be configured in the same manner as described with reference to FIG. 12 such that one or both the inductor 423 and the capacitor 425 are variable, and the adjustment in accordance with the change in environment can be achieved.

The balun 141 (FIG. 9) or the balun 151 (FIG. 10) can also be connected to the phase shifter 421 illustrated in FIGS. 19 to 21. Furthermore, the balun 151 (141) and the matching circuit 161 can also be connected to the phase shifter 421 illustrated in FIGS. 19 to 21.

The phase shifter 421 illustrated in FIGS. 19 to 21 can also be provided with, as described with reference to FIGS. 13 to 15, the resistor 201 corresponding to the equivalent series resistance, a plurality of the inductors 423 that is connected in parallel or in series, or the adjustment unit 221.

The circularly polarized antenna may have a configuration other than that exemplified here.

In the present specification, the system represents the entire device including a plurality of devices.

Note that, the effects described in the present description are merely examples and are not limited, and other effects may be provided.

Note that, the embodiments of the present technology are not limited to the above-described embodiments, and various changes can be made without departing from the gist of the present technology.

Note that, the present technology can also have the following configurations.

(1)

A communication device including:

a circularly polarized antenna that includes a first antenna element, and a second antenna element disposed orthogonally to the first antenna element; and a phase shifter that includes a capacitor connected to the first antenna element, and an inductor connected to the second antenna element, in which in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a value calculated by $C=1/\{\pi f(R+X)\}$, and an inductance of the inductor is a value calculated by $L=(R-X)/(4\pi f)$.

(2)

The communication device according to (1), in which the antenna is a balanced antenna.

(3)

The communication device according to (1) or (2), in which the capacitor and the inductor are short-circuited.

(4)

The communication device according to any one of (1) to (3), in which each of the first antenna element and the second antenna element is a dipole antenna, each of two radiation elements included in the first antenna element is connected to the capacitor, and each of two radiation elements included in the second antenna element is connected to the inductor.

(5)

The communication device according to any one of (1) to (4), further including a balun that is connected to the phase shifter.

(6)

The communication device according to (5), further including a matching circuit that is connected to the balun.

(7)

The communication device according to any one of (1) to (6), in which at least one of the capacitor or the inductor is variable.

(8)

The communication device according to any one of (1) to (7), in which a resistor that has a resistance value corresponding to an equivalent series resistance of the inductor is connected to the capacitor.

(9)

The communication device according to any one of (1) to (8), in which the inductor includes a plurality of the inductors that is connected in parallel or in series.

(10)

The communication device according to any one of (1) to (9), further including a power generation unit, in which the antenna is a propeller antenna, and the power generation unit generates power by rotation of the propeller antenna.

(11)

A communication device including:

a circularly polarized antenna that includes a first orthogonally linearly polarized antenna element and a second orthogonally linearly polarized antenna element; and a phase shifter that includes a capacitor connected to the first antenna element, and an inductor connected to the second antenna element, in which in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a value calculated by $C=1/\{2\pi f(R+X)\}$, and an inductance of the inductor is a value calculated by $L=(R-X)/(2\pi f)$.

(12)

The communication device according to (11), in which the antenna is an unbalanced antenna.

(13)

The communication device according to (11) or (12), in which each of the first antenna element and the second antenna element is a microstrip antenna.

(14)

The communication device according to (11) or (12), in which each of the first antenna element and the second antenna element is a monopole antenna.

(15)

The communication device according to any one of (11) to (14), in which the capacitor and the inductor are short-circuited.

(16)

The communication device according to any one of (11) to (15), in which at least one of the capacitor or the inductor is variable.

REFERENCE SIGNS LIST

1 Communication system
11 Master station
12 Communication station
13 Communication station
14 Satellite
21 Slave station
31 Slave station
32 Repeater
101 Signal processing unit
102 High-frequency processing unit
103 Antenna
111 Phase shifter
121 Capacitor
122 Inductor
141 Balun
151 Balun
161 Matching circuit
201 Resistor
221 Adjustment unit
301 Antenna
311 Movable contact portion
312 Transmission/reception circuit
313 Power generation unit
351 Electrode
353 Wiring line
355 Sheath portion
401 Antenna
411 Radiation element
413 Radiation element
421 Phase shifter
423 Inductor
425 Capacitor
431 Metal sheet
433 Hole
435 Antenna element

The invention claimed is:

1. A communication device comprising:

a circularly polarized antenna that includes a first antenna element, and a second antenna element disposed orthogonally to the first antenna element; and a phase shifter that includes a capacitor connected to the first antenna element, and an inductor connected to the second antenna element, wherein in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by R+jX, a capacitance of the capacitor is a value calculated by $C=1/\{\pi f(R+X)\}$, and an inductance of the inductor is a value calculated by $L=(R-X)/(4\pi f)$.

2. The communication device according to claim 1, wherein the antenna is a balanced antenna.

3. The communication device according to claim 1, wherein the capacitor and the inductor are short-circuited.

4. The communication device according to claim 1, wherein each of the first antenna element and the second antenna element is a dipole antenna, each of two radiation elements included in the first antenna element is connected to the capacitor, and each of two radiation elements included in the second antenna element is connected to the inductor.

5. The communication device according to claim 1, further comprising a balun that is connected to the phase shifter.

6. The communication device according to claim 5, further comprising a matching circuit that is connected to the balun.

7. The communication device according to claim 1, wherein at least one of the capacitor or the inductor is variable.

8. The communication device according to claim 1, wherein a resistor that has a resistance value corresponding to an equivalent series resistance of the inductor is connected to the capacitor.

9. The communication device according to claim 1, wherein the inductor includes a plurality of the inductors that is connected in parallel or in series.

10. The communication device according to claim 1, further comprising a power generation unit, wherein the antenna is a propeller antenna, and the power generation unit generates power by rotation of the propeller antenna.

11. A communication device comprising:

a circularly polarized antenna that includes a first orthogonally linearly polarized antenna element and a second orthogonally linearly polarized antenna element; and a phase shifter that includes a capacitor connected to the first antenna element, and an inductor connected to the second antenna element, wherein in a case where a resistance is denoted by R, an imaginary unit is denoted by j, a reactance is denoted by X, a center frequency of the antenna is denoted by f, a capacitance is denoted by C, and an inductance is denoted by L, an impedance of the antenna is represented by $R+jX$, a capacitance of the capacitor is a value calculated by $C=1/\{2\pi f(R+X)\}$, and an inductance of the inductor is a value calculated by $L=(R-X)/(2\pi f)$.

12. The communication device according to claim 11, wherein the antenna is an unbalanced antenna.

13. The communication device according to claim 11, wherein each of the first antenna element and the second antenna element is a microstrip antenna.

14. The communication device according to claim 11, wherein each of the first antenna element and the second antenna element is a monopole antenna.

15. The communication device according to claim 11, wherein the capacitor and the inductor are short-circuited.

16. The communication device according to claim 11, wherein at least one of the capacitor or the inductor is variable.

* * * * *